(12) United States Patent
Gupta et al.

(10) Patent No.: US 7,518,067 B2
(45) Date of Patent: Apr. 14, 2009

(54) METAL CAGE STRUCTURE AND METHOD FOR EMI SHIELDING

(75) Inventors: Mayank Gupta, Sunnyvale, CA (US); Mario Pelella, Mountain View, CA (US); Farzin Assad, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 139 days.

(21) Appl. No.: 11/528,253

(22) Filed: Sep. 27, 2006

(65) Prior Publication Data
US 2008/0073115 A1    Mar. 27, 2008

(51) Int. Cl.
*H01R 4/38* (2006.01)
*H05K 9/00* (2006.01)

(52) U.S. Cl. .................. 174/376; 174/384; 174/387; 257/660; 361/818

(58) Field of Classification Search ................ 174/377, 174/384, 376, 387; 361/816, 818, 800; 257/659, 257/660
See application file for complete search history.

(56) References Cited

U.S. PATENT DOCUMENTS

| 5,763,824 A * | 6/1998 | King et al. ............... 174/374 |
| 6,570,776 B2 * | 5/2003 | MacDonald et al. ........ 361/818 |
| 2005/0101161 A1 * | 5/2005 | Weiblen et al. .............. 439/37 |

\* cited by examiner

*Primary Examiner*—Hung V Ngo
(74) *Attorney, Agent, or Firm*—Farjami & Farjami LLP

(57) ABSTRACT

According to one exemplary embodiment, a structure comprises an electronic device situated over a substrate of a semiconductor die. The structure further includes a metal cage comprising a number of contacts situated over the substrate and surrounding the electronic device. The contacts form a lateral EMI shield portion of the metal cage. The structure also includes a number of vias connecting a number of metal interconnect segments to the contacts. The metal interconnect segments form a top EMI shield portion of the metal cage.

17 Claims, 4 Drawing Sheets

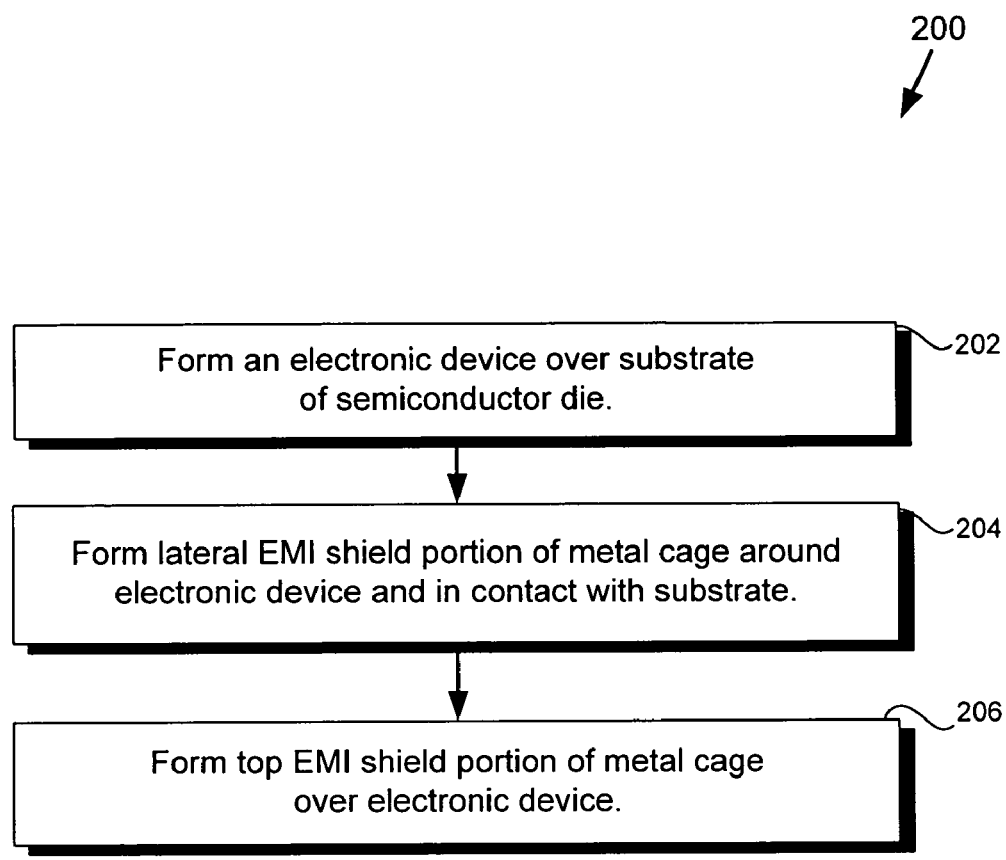

METAL CAGE STRUCTURE AND METHOD FOR EMI SHIELDING

TECHNICAL FIELD

The present invention relates generally to the field of semiconductor devices. More particularly, the present invention is related to EMI shields in semiconductor devices.

BACKGROUND ART

One cause of electromagnetic interference ("EMI") is the electromagnetic radiation emitted by electronic devices. EMI produced by one electronic device can interrupt, obstruct, or degrade effective performance of other electronic devices. EMI can propagate between electronic devices by radiation; EMI can also propagate between electronic devices by conduction when adjacent electronic devices are physically connected. Additionally, EMI can propagate by induction, when an EMI signal is induced magnetically, or by capacitive coupling to another electronic device.

Previous efforts to protect electronic devices from electromagnetic interference have focused on shielding an entire semiconductor die from outside interference. However, this solution requires a large and costly shielding structure. Since this solution shields the entire semiconductor die, it is not possible to independently test the effect of electromagnetic interference on individual electronic devices in the semiconductor die. Additionally, the individual electronic devices are shielded only from outside interference, not from interfering with one another. Other solutions have focused on shielding the interconnects between electronic devices, or between a semiconductor die and other modules. However, shielding interconnects does not protect individual electronic devices.

SUMMARY

The present invention is directed to a metal cage structure and method for EMI shielding. The present invention addresses and resolves the need in the art for a structure that occupies a small area of a semiconductor die, can be manufactured at a reduced cost, and protects an electronic device against both external and internal EMI on a semiconductor die.

According to one exemplary embodiment, the invention's structure comprises an electronic device situated over a substrate of a semiconductor die. The structure further includes a metal cage comprising a number of contacts situated over the substrate and surrounding the electronic device. The contacts form a lateral EMI shield portion of the metal cage. The structure can also include a number of metal interconnect segments forming a top EMI shield portion of the metal cage. This embodiment of the invention results in a structure that occupies a small area of a semiconductor die, can be manufactured at a reduced cost, and protects an electronic device against both external and internal EMI on a semiconductor die.

In another embodiment, the invention is a method for achieving the above described structure. In still another embodiment the invention is a system utilizing the above-described innovative structure. Other features and advantages of the present invention will become more readily apparent to those of ordinary skill in the art after reviewing the following detailed description and accompanying drawings.

BRIEF DESCRIPTION OF THE DRAWINGS

FIG. 2 shows a flowchart illustrating the steps taken to implement an embodiment of the present invention.

DETAILED DESCRIPTION OF THE INVENTION

The present invention is directed to a metal cage structure and method for EMI shielding. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1A:
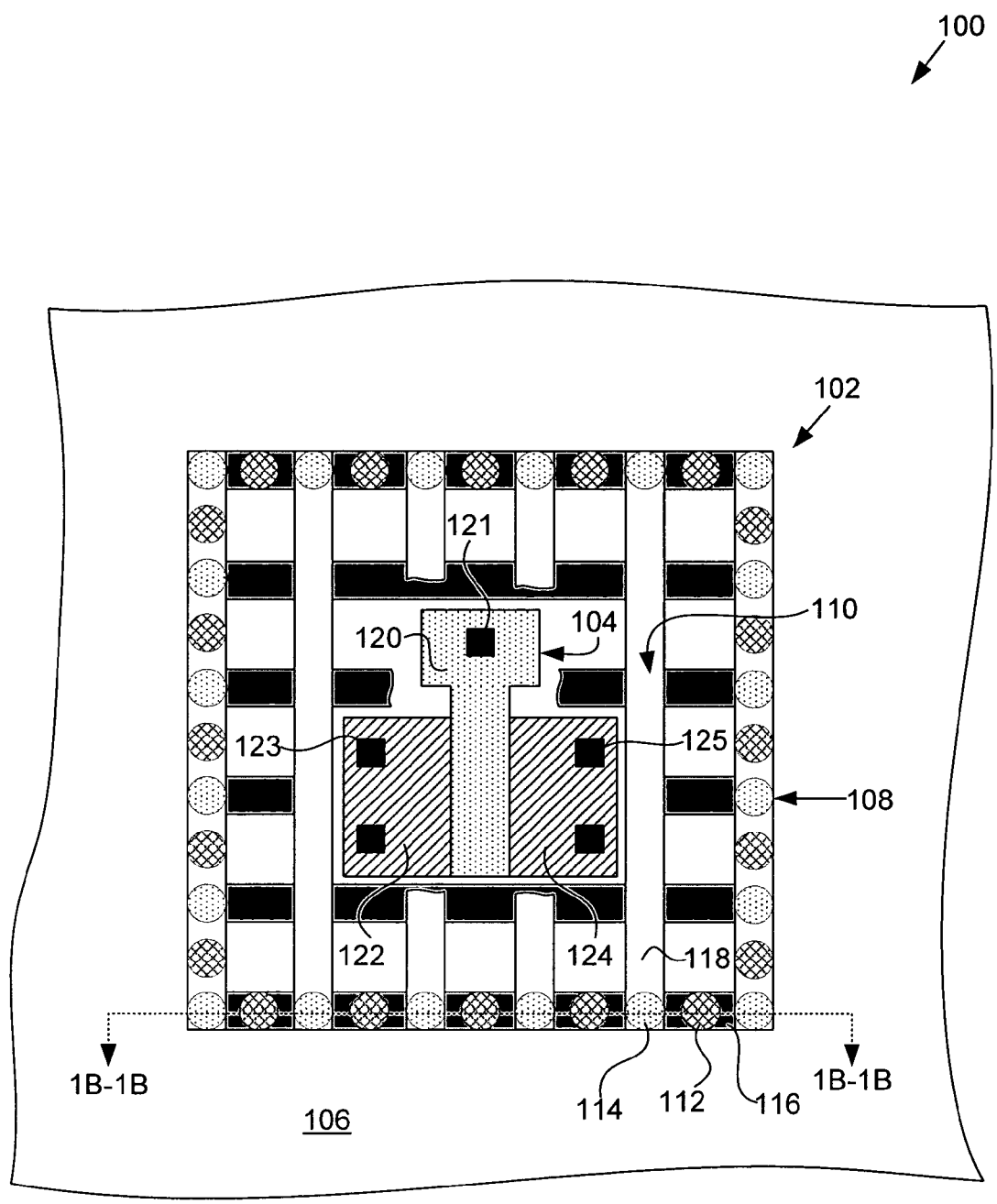
FIG. 1A shows a top view of an exemplary structure in accordance with one embodiment of the present invention.

FIG. 1A shows a top view of an exemplary structure 100 in a semiconductor die including metal cage 102 and electronic device 104 situated over substrate 106. Metal cage 102 includes lateral EMI shield portion 108 and top EMI shield portion 110. Lateral EMI shield portion 108 includes a number of contacts 112 and vias 114, which are situated around electronic device 104. Top EMI shield portion 110 includes a number of metal interconnect segments, such as metal interconnect segments 116 and 118. Metal interconnect segments 116 and 118 are generally formed substantially perpendicular to contacts 112 and connected by vias 114. An example of electronic device 104 is a transistor which includes gate 120, source 122, and drain 124. In this example, gate 120 includes gate contact 121, source 122 includes source contacts 123, and drain 124 includes drain contacts 125.

In FIG. 1A, contacts 112 and vias 114 form the lateral EMI shield portion 108 of metal cage 102, and are arranged around electronic device 104 in a substantially square shape. However, contacts 112 and vias 114 can also be arranged in any other shape around electronic device 104, such as in the shape of a circle, rectangle, oval, or trapezoid, for example. Contacts 112 can be formed in an interlayer dielectric (not shown in FIG. 1A) and can comprise any type of metal, such as tungsten, aluminum, copper, titanium, or metal alloys of various compositions. Vias 114 can be formed in another interlayer dielectric (not shown in FIG. 1A) and can comprise any type of metal, such as aluminum, copper, titanium, or metal alloys of various compositions, for example.

Vias 114 connect metal interconnect segments 116 and 118 to contacts 112. Metal interconnect segments 116 and 118 form the top EMI shield portion 110 of metal cage 102 which is situated over and surrounds electronic device 104. Also as shown in FIG. 1A, metal interconnect segments 116 are aligned perpendicular to metal interconnect segments 118. However, in other embodiments, metal interconnect segments 116 and 118 may not be aligned perpendicular to one another. Metal interconnect segments 116 and 118 can be formed and patterned by depositing metal in a metal interconnect layer of semiconductor die, and can comprise any type of metal, such as aluminum, copper, titanium, or metal alloys of various compositions, for example. For ease of illustration, a section of top EMI shield portion 110 is not shown in FIG. 1A in order not to obscure electronic device 104.

In the present embodiment, electronic device 104 can be a metal-oxide-semiconductor field-effect transistor (MOSFET), such as an NMOS or PMOS. Interconnections for accessing gate 120, source 122, and drain 124 are not shown to preserve ease of illustration of the innovative aspects of the present invention. In other embodiments, electronic device 104 can be a metal-insulator-metal capacitor (MIMCAP) or other type of electronic device as known in the art.

Figure 1B:
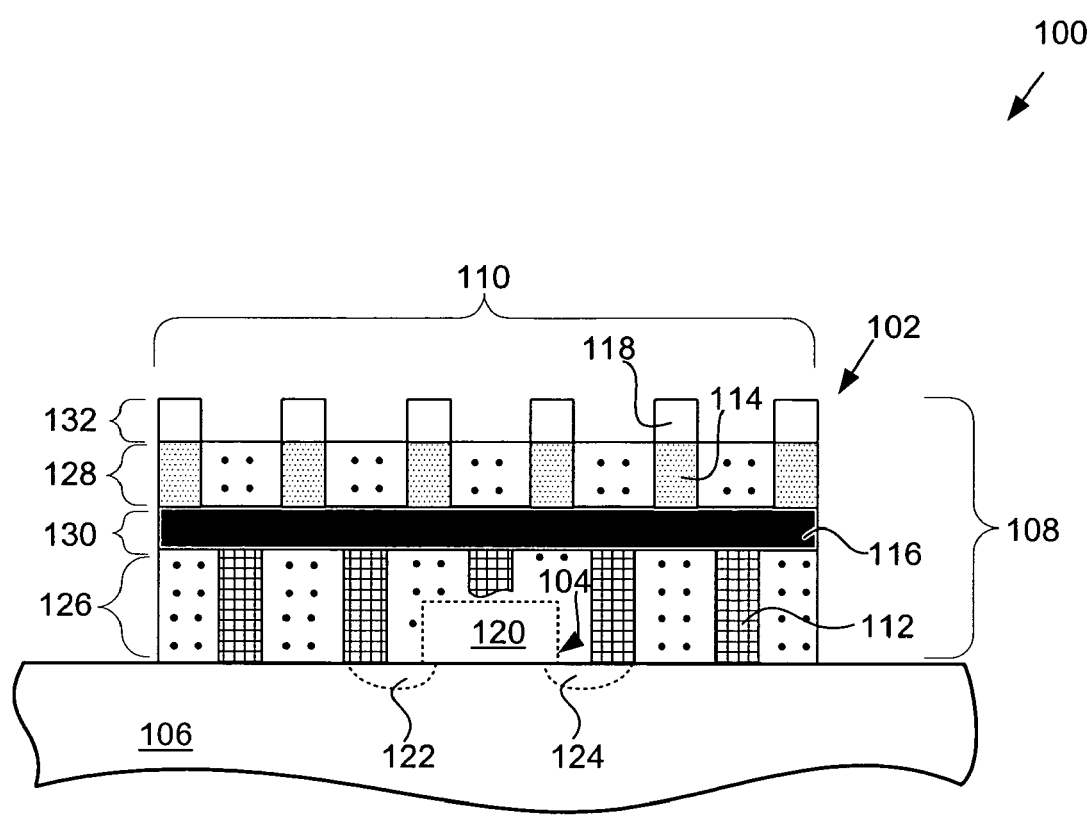
FIG. 1B shows a cross-sectional view of an exemplary structure in accordance with one embodiment of the present invention.

FIG. 1B shows a cross-sectional view of exemplary structure 100 in a semiconductor die along line 1B-1B in FIG. 1A. In particular, metal cage 102, electronic device 104, substrate 106, lateral EMI shield portion 108, top EMI shield portion 110, contacts 112, vias 114, metal interconnect segments 116 and 118, gate 120, source 122, and drain 124, correspond to the same elements in FIG. 1A. Structure 100 further includes interlayer dielectrics 126 and 128, which can comprise any dielectrics typically used in the art, for example, silicon oxide or other dielectrics, including various high-k or low-k dielectrics used in the semiconductor industry. Additionally, FIG. 1B shows metal interconnect segments 116 and 118 located in metal interconnect layers 130 and 132 of the semiconductor die.

As described above, lateral EMI shield portion 108 includes contacts 112 and vias 114, and top EMI shield portion 110 includes metal interconnect segments, such as metal interconnect segments 116 and 118. Contacts 112 are formed in interlayer dielectric and extend between substrate 106 and metal interconnect layer 130. Vias 114 are formed in interlayer dielectric 128 and extend from metal interconnect layer 130 to metal interconnect layer 132. As shown in FIG. 1B, contacts 112 and vias 114 that form lateral EMI shield portion 108 are not vertically aligned and do not form continuous metal columns. In another embodiment, contacts 112 and vias 114 can be vertically aligned and form continuous metal columns. Metal interconnect segments 116 and 118 which comprise top EMI shield portion 110 are formed in respective metal interconnect layers 130 and 132, and are connected by vias 114 to contacts 112. In the present embodiment, top EMI shield portion 110 can be formed in two metal interconnect layers in a semiconductor die. For ease of illustration, only two metal interconnect layers are shown in FIG. 1B, however, the semiconductor die can have any number of metal interconnect layers and, in other embodiments, top EMI shield portion 110 can be formed in a single metal interconnect layer or in more than two metal interconnect layers in the semiconductor die. In one embodiment, electronic device 104 is a MIMCAP. Since a MIMCAP is typically formed in the metal interconnect layers of a semiconductor die, top EMI shield portion 110 can be formed overlying the MIMCAP in additional metal interconnect layers that are not shown in FIG. 1B. For example, a bottom plate of the MIMCAP can be formed in a first metal interconnect layer, such as metal interconnect layer 130. A top plate of the MIMCAP can be formed in metal interconnect layer 132, or in an intermediate metal interconnect layer residing between metal interconnect layers 130 and 132. Top EMI shield portion 110 can then be formed in at least one of the metal interconnect layers that overlie the MIMCAP. This can include a single metal interconnect layer over the MIMCAP, several metal interconnect layers over the MIMCAP, or two metal interconnect layers over the MIMCAP, as described above.

By situating a top EMI shield portion over an electronic device, and a lateral EMI shield portion around the electronic device, the metal cage of the present invention advantageously achieves an EMI shield for shielding an electronic device from EMI generated within the semiconductor die (i.e. internal EMI) as well as EMI generated outside of the semiconductor die (i.e. external EMI). The metal cage of the present invention advantageously prevents EMI generated by the shielded electronic device from interfering with adjacent electronic devices. Shielding the individual electronic devices on a semiconductor die allows for individual isolation and improved testing of electronic devices on a semiconductor die. For example, individual electronic devices can be accurately tested for electromagnetic noise.

FIG. 2 shows a flowchart illustrating an exemplary method according to an embodiment of the present invention. Certain details and features have been left out of flowchart 200 that are apparent to a person of ordinary skill in the art. For example, a step may consist of one or more substeps or may involve specialized equipment or materials, as known in the art.

Referring now to step 202 of flowchart 200 in FIG. 2, electronic device 104 in FIG. 1A can be formed over substrate 106. For example, electronic device 104 can be a MOSFET. In one embodiment, electronic device 104 can be a MIMCAP. At step 204 of flowchart 200, lateral EMI shield portion 108 of metal cage 102 is formed on substrate 106 and surrounds electronic device 104. Lateral EMI shield portion 108 includes contacts 112 and vias 114, arranged as described above and shown in FIGS. 1A and 1B. For example, contacts 112 and vias 114 can be formed by etching holes in interlayer dielectrics 126 and 128 and depositing a metal in the holes in a manner known in the art. At step 206 of flowchart 200, top EMI shield portion 110 of metal cage 102 is formed over electronic device 104. Top EMI shield portion 110 includes a number of metal interconnect segments 116 and 118, which are connected to contacts 112 by vias 114. Metal interconnect segments 116 and 118 are formed in respective metal interconnect layers 130 and 132 of the semiconductor die, in a manner known in the art.

Figure 3:
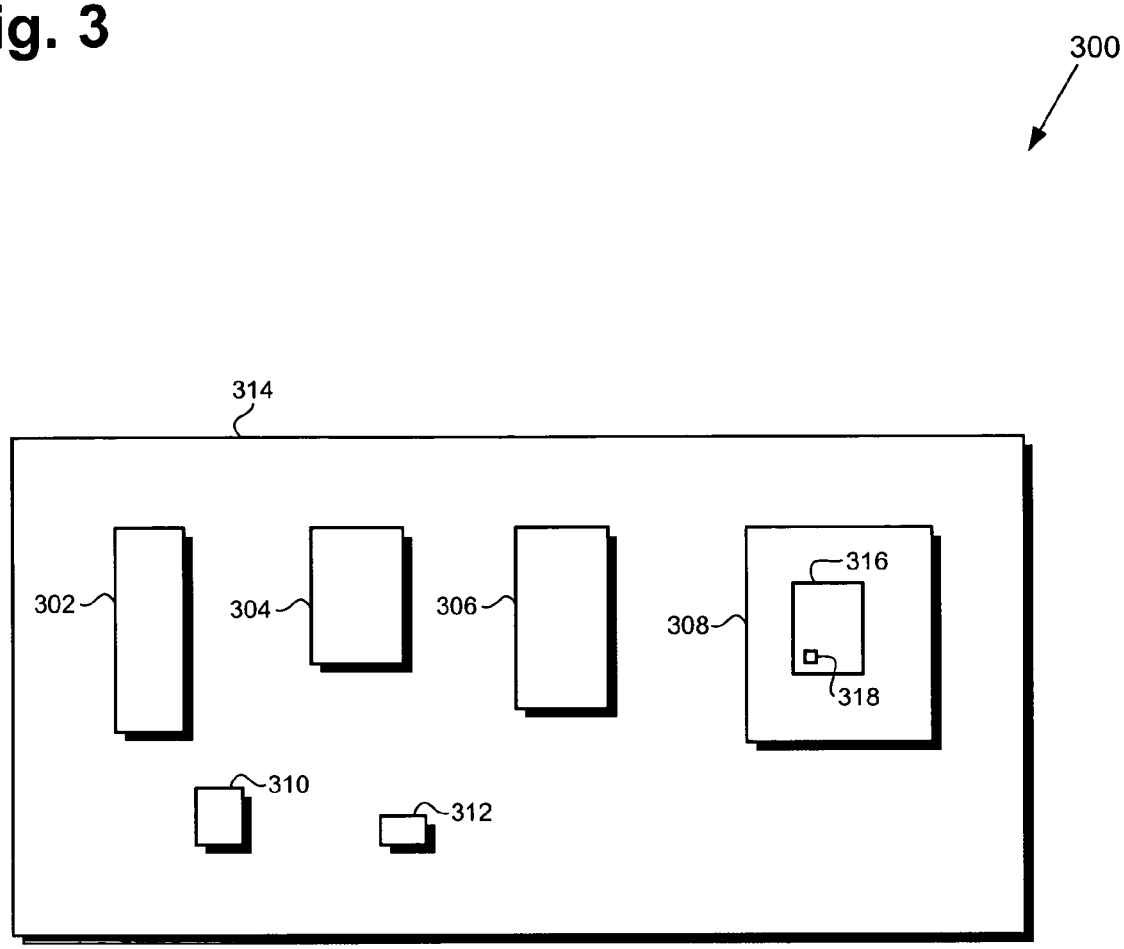
FIG. 3 illustrates a diagram of an exemplary electronic system including an exemplary chip or die utilizing one or more structures in accordance with one embodiment of the present invention.

FIG. 3 illustrates a diagram of an exemplary electronic system including an exemplary semiconductor chip or die utilizing one or more metal cage EMI shield structures in accordance with one embodiment of the present invention. Electronic system 300 includes exemplary modules 302, 304, and 306, IC semiconductor chip or semiconductor die 308, discrete components 310 and 312, residing in and interconnected through circuit board 314. In one embodiment, electronic system 300 may include more than one circuit board. IC chip 308 includes circuit 316, which utilizes one or more of the invention's metal cage EMI shield structures designated by numeral 318.

As shown in FIG. 3, modules 302, 304, and 306 are mounted on circuit board 314 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electro-mechanical motor control module, or a field programmable gate array (FPGA), or any other kind of module utilized in modern electronic circuit boards. Circuit board 314 can include a number of interconnect traces (not shown in FIG. 3) for interconnecting modules 302, 304, and 306, discrete components 310 and 312, and IC chip 308.

Also shown in FIG. 3, IC chip 308 is mounted on circuit board 314 and can be, for example, any chip utilizing an embodiment of the present invention's metal cage EMI shield structure. In one embodiment, IC chip 308 may not be mounted on circuit board 314, and may be interconnected with other modules on different circuit boards. As stated above, circuit 316 is situated in IC chip 308 and includes one or more embodiments of the invention's metal cage EMI shield structures 318. Further shown in FIG. 3, discrete components 310 and 312 are mounted on circuit board 314 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor. Discrete components 310 and 312 may themselves utilize one embodiment of the invention's metal cage EMI shield structures.

Electronic system 300 can be utilized in, for example, a wired or wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring equipment, a digital avionics device, a medical device, or a digitally-controlled medical equipment, or in any other kind of system, device, component or module utilized in modern electronics applications.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus a metal cage structure and method for EMI shielding has been described.

The invention claimed is:

1. A structure situated in a semiconductor die, said structure comprising:
    an electronic device situated over a substrate of said semiconductor die;
    a metal cage comprising a plurality of contacts situated over said substrate and surrounding said electronic device, said plurality of contacts forming a lateral EMI shield portion of said metal cage, said metal cage further comprising a plurality of vias connecting a plurality of metal interconnect segments to said plurality of contacts, said plurality of metal interconnect segments forming a top EMI shield portion of said metal cage.

2. The structure of claim 1 wherein said top EMI shield portion is formed in an at least one metal interconnect layer of said semiconductor die.

3. The structure of claim 1 wherein said plurality of contacts and said plurality of vias are vertically aligned.

4. The structure of claim 1 wherein said electronic device is a MOSFET.

5. The structure of claim 1 wherein said electronic device is a MIMCAP.

6. The structure of claim 1 wherein said plurality of contacts are situated around said electronic device in a shape selected from the group consisting of a rectangle, square, circle, oval, and trapezoid.

7. A method of shielding an electronic device from electromagnetic interference, said method comprising steps of:
    forming said electronic device over a substrate of a semiconductor die;
    forming a lateral EMI shield portion of a metal cage, said lateral EMI shield portion comprising a plurality of contacts and a plurality of vias, said plurality of contacts and said plurality of vias situated over said substrate and surrounding said electronic device;
    forming a top EMI shield portion of said metal cage with a plurality of metal interconnect segments formed over said electronic device, said plurality of metal interconnect segments being connected to said plurality of contacts by said plurality of vias.

8. The method of claim 7 wherein said top EMI shield portion is formed in an at least one metal interconnect layer of said semiconductor die.

9. The method of claim 7 wherein said plurality of contacts and said plurality of vias are vertically aligned.

10. The method of claim 7 wherein said electronic device is a MOSFET.

11. The method of claim 7 wherein said electronic device is a MIMCAP.

12. The method of claim 7 wherein said plurality of contacts are situated around said electronic device in a shape selected from the group consisting of a rectangle, square, circle, oval, and trapezoid.

13. A circuit board comprising a structure situated in a semiconductor die, said structure comprising:
    an electronic device situated over a substrate of said semiconductor die;
    a metal cage comprising a plurality of contacts situated over said substrate and surrounding said electronic device, said plurality of contacts forming a lateral EMI shield portion of said metal cage, said metal cage further comprising a plurality of vias connecting a plurality of metal intel-connect segments to said plurality of contacts, said plurality of metal interconnect segments forming a top EMI shield portion of said metal cage.

14. The circuit board of claim 13 wherein said top EMI shield portion is formed in an at least one metal interconnect layer of said semiconductor die.

15. The circuit board of claim 13 wherein said plurality of contacts and said plurality of vias are vertically aligned.

16. The circuit board of claim 13 wherein said electronic device is selected from the group consisting of a MOSFET and a MIMCAP.

17. The circuit board of claim 13 utilized in an electronic system, wherein said electronic system is selected from the group consisting of a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), digital game playing device, a digital testing and/or measuring device, a digital avionics device, a medical device, and a digitally-controlled medical equipment.

* * * * *